(12) United States Patent
Carlach et al.

(10) Patent No.: US 9,100,048 B2
(45) Date of Patent: Aug. 4, 2015

(54) METHOD AND DEVICE FOR TRANSMISSION AND RECEPTION IN A MULTI-INPUT AND MULTI-OUTPUT CHANNEL DISTRIBUTING A CODE WORD BETWEEN SEVERAL MAPPING MATRICES, AND CORRESPONDING COMPUTER PROGRAM

(75) Inventors: Jean-Claude Carlach, Rennes (FR); Ali El Arab, Rennes (FR); Maryline Helard, Rennes (FR)

(73) Assignee: Orange, Paris (FR)

( * ) Notice: Subject to any disclaimer, the term of this patent is extended or adjusted under 35 U.S.C. 154(b) by 106 days.

(21) Appl. No.: 13/819,605

(22) PCT Filed: Aug. 29, 2011

(86) PCT No.: PCT/FR2011/051977
§ 371 (c)(1),
(2), (4) Date: Feb. 27, 2013

(87) PCT Pub. No.: WO2012/042140
PCT Pub. Date: Apr. 5, 2012

(65) Prior Publication Data
US 2013/0159817 A1 Jun. 20, 2013

(30) Foreign Application Priority Data

Aug. 27, 2010 (FR) .................................... 10 56819

(51) Int. Cl.
*H03M 13/05* (2006.01)
*H04L 1/00* (2006.01)
*H04L 1/06* (2006.01)

(Continued)

(52) U.S. Cl.
CPC ............. *H03M 13/05* (2013.01); *H04L 1/0057* (2013.01); *H04L 1/06* (2013.01); *H04L 25/03343* (2013.01); *H04L 25/497* (2013.01); *H04B 7/0413* (2013.01); *H04L 2025/03426* (2013.01)

(58) Field of Classification Search
CPC ... H04L 1/0057; H04L 1/0061; H04L 1/0041; H04L 1/0083; H04L 1/0072; H04L 1/06; H04L 25/03343; H04L 25/497; H03M 13/05
USPC .......................................... 714/758, 776, 777
See application file for complete search history.

(56) References Cited

U.S. PATENT DOCUMENTS

2010/0254467 A1* 10/2010 Braun et al. .................. 375/260

OTHER PUBLICATIONS

Sung, Chang-Kyung, et al. "Quasi-Orthogonal STBC with Iterative Decoding in Bit Interleaved Coded Modulation," Vehicular Technology Conference, IEEE 60th vol. 2, pp. 1323-1327, Fall 2004.*

(Continued)

*Primary Examiner* — Albert Decady
*Assistant Examiner* — Kyle Vallecillo
(74) *Attorney, Agent, or Firm* — David D. Brush; Westman, Champlin & Koehler, P.A.

(57) ABSTRACT

A method for transmitting a source binary sequence, including at least one source word, in a transmission channel. The method includes the following steps, for at least one source word: error-correcting encoding the source word, outputting a code word; matrix mapping the code word, distributing bits constituting the code word within at least two mapping matrices, which are reversible and observe a criterion of uniqueness in the cancellation of a syndrome associated with the code word; and consecutively transmitting the at least two mapping matrices.

11 Claims, 6 Drawing Sheets

(51) Int. Cl.
H04L 25/03 (2006.01)
H04L 25/497 (2006.01)
H04B 7/04 (2006.01)

(56) References Cited

OTHER PUBLICATIONS

International Search Report and Written Opinion dated Jan. 4, 2012 for corresponding International Application No. PCT/FR2011/051977, filed Aug. 29, 2011.

Chang-Kyung Sung et al., "Quasi-Orthogonal STBC with Iterative Decoding in Bit Interleaved Coded MOdulation", 2004 IEEE 60th Vehicular Technology Conference. VTC2004-FALL (IEEE Cat. No. 04CH37575) IEEE Piscataway, NJ, USA, vol. 2, Sep. 26, 2004, pp. 1323-1327, XP010786839.

Borgmann, Bolcskei H., "Noncoherent Space-Frequency Coded MIMO-OFDM", IEEE Journal on Selected Areas in Communications, IEEE Service Center, Piscataway, USA, vol. 23, No. 9, Sep. 1, 2005, pp. 1799-1810, XP011138715.

International Preliminary Report on Patentability and English translation of Written Opinion dated Mar. 5, 2013 for corresponding International Application No. PCT/FR2011/051977, filed Aug. 29, 2011.

French Search Report and Written Opinion dated May 21, 2011 for corresponding French Application No. 1056819, filed Aug. 27, 2010.

Hassan et al., "Turbo-Product Codes Decoding for Concatenated Space-Time Error-Correcting Codes", 20th International Symposium PIMRC'2009, pp. 1049-1053, Sep. 13-16, 2009.

Borgmann et al., "Codes Design for Non-Coherent MIMO-OFDM Systems" Allerton Conference 2002, pp. 237-246.

Hughes, "Differential Space-Time Modulation", IEEE Transactions on Information Theory, vol. 46, No. 7. pp. 2567-2578, Nov. 2000.

F. J. Macwilliams et al., "The Theory of Error-Correcting Codes", North Holland Amsterdam, 1977, Chapter 19, paragraph 3.

Pillai et al., "A Review on Issues Related to the Implementation 30 of Turbo-Codes and Space-Time Trellis Codes", AFRICON, 2004. 7th AFRICON Conference in Afroca vol. 1 Publication Year 2004, pp. 121-126, vol. 1.

Cadic et al., "Low Complexity Tail-Biting Trellises of Self-Dual Codes of Length 24, 32 and 40 over GF(4) and Z4 of Large Minimum Distance", In proceedings of the 14th International Symposium on Applied Algebra, Algebraic Algorithms and Error Correcting Codes (AAECC'14), Melbourne (Australia), S. Boztas and I. Shparlinski (Eds.) Ed. Springer Verlag, pp. 57-66 Nov. 2011.

* cited by examiner

METHOD AND DEVICE FOR TRANSMISSION AND RECEPTION IN A MULTI-INPUT AND MULTI-OUTPUT CHANNEL DISTRIBUTING A CODE WORD BETWEEN SEVERAL MAPPING MATRICES, AND CORRESPONDING COMPUTER PROGRAM

CROSS-REFERENCE TO RELATED APPLICATIONS

This Application is a Section 371 National Stage Application of International Application No. PCT/FR2011/051977, filed Aug. 29, 2011, which is incorporated by reference in its entirety and published as WO 2012/042140 on Apr. 5, 2012, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of digital communications.

More specifically, the disclosure pertains to the transmission of data by radio-electrical communications or radio communications and more particularly radio transmission systems with several sending antennas and several receiving antennas known as MIMO or multi-input multi-output radio transmission systems.

The disclosure can be applied especially in digital radio networks such as GSM or UMTS systems or WiFi radio networks as well as future communications systems according to the future 4G, LTE standards or communications between vehicles, objects or communicating machines, etc.

The disclosure can be applied especially in systems for transmitting digital data on electrical cables as in ADSL systems or the CPL system on electrical power cables subjected to multiple interferences between communications transmitted on neighboring cables.

The disclosure can also be applied to systems using the antenna lobe-forming or beamforming space-time filtering techniques and to systems using the technique of time-reversal of the response of the channel.

BACKGROUND OF THE DISCLOSURE

There are several known types of MIMO techniques, the general scheme of which is illustrated in FIG. 1, for a sent signal x and a received signal $\hat{x}$ with $n_t$ sending antennas, $n_r$ receiving antennas and a MIMO channel matrix denoted as $H_{n_t \times n_r}$.

The initial goal of MIMO techniques is to exploit the spatial and temporal diversity (or frequency diversity) of multi-antenna systems and to improve their capacity.

However, the error-correcting function, also called the channel-decoding function, has been taken into account only recently in the building of MIMO space-time codes, as is described in the document "*M. S. Hassan, K. Amis, "Turbo-Product Codes Decoding for Concatenated Space-Time Error-Correcting Codes", 20th International Symposium PIMRC '2009, pp. 1049-1053, 13-16 Sep. 2009*".

Certain of these MIMO techniques, known as "coherent" techniques require perfect knowledge of the channel when sending or receiving, and other techniques, called "non-coherent" techniques do not require any knowledge of the channel whether at sending or at receiving.

These coherent MIMO techniques include especially two families: the STBC (space-time block codes) techniques and the STTC (space-time trellis codes) techniques.

The existing non-coherent MIMO techniques implement block encoding adapted to the above-mentioned coherent STBC or STTC techniques. These non-coherent MIMO techniques correspond actually to an extension, to the MIMO case, of the differential technique used for SISO (single-input single-output) differential systems: this is the classic case with a single antenna for sending and receiving.

The basic principles of the differential codes is the following: the symbol transmitted at the instant (t) is equal to the symbol transmitted at the instant (t−1) multiplied by a complex matrix Vt or a simple complex carrier of the information. The information to be transmitted is therefore to be encoded by the transition from one symbol to another and not by the value or state of each symbol.

The basic hypothesis for this differential technique is that the channel is assumed to be constant for a long data block (at least several hundreds of data pieces) to be transmitted.

The simplest solution for extending these differential codes to the MIMO case is to use orthogonal space-time codes because they enable the generation of perfectly orthogonal virtual SISO channels in the MIMO channel and thus enable the performance of differential encoding on each virtual channel. There are several examples of this in the literature, some of them especially present in the document by H. Bölckei and M. Borgmann, "*Codes Design for Non-Coherent MIMO-OFDM Systems*" Allerton Conference 2002, pp. 237-246.

These non-coherent MIMO differential techniques however do not implement any error correcting and therefore do not have any encoding gain. Their sole goal is to enable the detection of the data transmitted without knowledge of the propagation channel.

A first drawback of these techniques lies in a 3 dB loss of performance as compared with transmissions made with knowledge of the propagation channel, at least in part because of the absence of encoding gain due to the absence of error-correcting encoding.

One solution to the question of obtaining encoding gain for these differential techniques is to combine them with an error-correcting code in the form of two disjointed functions. The performance is then improved but the 3 dB loss at the differential detection level cannot be compensated for. To try to overcome this drawback, certain studies have been conducted in order to set up an iterative reception as presented for example in the document B. L. Hughes, "*Differential Space-Time Modulation*", IEEE transactions on Information Theory, Vol. 46, No. 7, pages 2567-2578, November 2000. This iterative reception makes it possible to communicate the two detection and error-correcting functions successively and iteratively by exchange of intrinsic information between the two functions, in order to enable the reduction only in part of this 3 dB loss resulting from the differential detection.

However, the main drawback of these differential techniques lies in the need to assume that the channel is constant during a long block of data elements to be transmitted, which is the basic assumption of these techniques. This assumption is indeed highly constraining and unrealistic, especially for the radio-electrical channels used in practice for transmissions to and from the mobile terminals.

There is therefore a need for a new technique for transmitting non-coherent MIMO data by which it is possible to overcome the constraint which assumes that the channel is constant for a long block of data to be transmitted and offers better performance in terms of transmission bit rate and/or quality of service for the clients.

SUMMARY

An exemplary embodiment of the invention relates to a method for sending a source binary sequence comprising at least one source word x, in a transmission channel.

According to an embodiment of the invention, a sending method of this kind comprises the following steps for at least one source word:
- error-correcting encoding of the source word x delivering a code word c;
- distribution of the bits forming the code word c in at least two matrices called mapping matrices, invertible and complying with a criterion of uniqueness of the cancellation of the syndrome associated with the code word c, said distribution step being called a matrix mapping step;
- successive sending of the two mapping matrices.

Thus, an embodiment of the invention relies on a novel and inventive approach to the transmission of source data in a transmission channel, enabling more robust and better-performance transmission without requiring any knowledge of the channel in combining a novel matrix modulation with an error-correcting encoding.

To this end, in a first stage, an embodiment of the invention applies an error-correcting encoding to at least one source word and delivers a code word.

In a second stage, an embodiment of the invention implements a mapping or a correspondence of the code word delivered, enabling the bits of this code word to be distributed among at least two specific matrices, called mapping matrices, presenting certain characteristics making it possible, when decoding, to rebuild the code word sent with improved performance as compared with the prior art, while at the same time removing any need for knowledge of the channel. These characteristics are invertibility and compliance with a criterion of uniqueness of cancellation of the syndrome associated with the code word.

The choice of invertible matrices makes it possible to obtain an estimation of the channel and therefore to overcome the need for knowledge of the channel, as described in Appendix A, which is an integral part of the description.

Furthermore, the characteristic of compliance with the criterion of uniqueness of the cancellation of the syndrome ensures that only one code word, corresponding to a unique pair of mapping matrices, cancels the syndrome and therefore enables the matrices received to be decoded efficiently. This is also described in Appendix A and in greater detail here below in the description.

According to one particular aspect of an embodiment of the invention, the criterion of uniqueness of the cancellation of the syndrome is written as follows, for a matrix mapping step delivering two matrices to be sent $M_\alpha$ and $M_\beta$ associated with the code word c:

$$M_\alpha \cdot M_a^{-1} - M_\beta \cdot M_b^{-1} = 0,$$

with $(M_a, M_b)$ being a unique pair of matrices corresponding to the code word c in a perfect case of constant channel transmission.

Thus, the mapping matrices $M_\alpha$ and $M_\beta$ associated with the code word c are chosen so that when they are multiplied respectively by the inverted matrices of $M_a$ and $M_b$, the difference in products gets cancelled out. The matrix $[M_a^{-1}, -M_b^{-1}]$ plays a role equivalent to that of a control matrix of an error-correcting code. The decoding algorithm will therefore consist in finding the unique pair of matrices $(M_a, M_b)$ minimizing the norm of the syndrome associated with the code word c among the set of possible pairs $(M_a, M_b)$ corresponding to the possible code words c sent, as described in greater detail here below.

According to one particular embodiment of the invention, the mapping step comprises a sub-step of permutation of the bits of the code word c, preliminarily to the distribution of the bits forming the code word c.

This permutation of the bits of the code word makes it possible for example to select mapping matrices from a known set of matrices.

For example, one configuration of possible permutations consists in not permutating the i first bits of the n-bit code word (identity permutation denoted as $\pi_0$), and in permutating the n−i last bits of the code word according to a $\pi_1$ permutation, such that (0,1,2,3) gives (0,3,2,1).

For example, this sub-step of permutation makes it possible to implement a mapping step distributing at least four bits $(c_0, c_1, c_2, c_3)$ composing the code word c in a mapping matrix selected from a known set of invertible matrices with complex coefficients, denoted as the Weyl group, described in greater detail here below in the description.

In particular, applying permutations of the bits of the code word enables the selection of a first mapping matrix from a first subset of matrices of the Weyl group, also called a lateral class or coset denoted as $C_0$, and a second mapping matrix in a second subset of matrices of the Weyl group denoted as $C_2$.

This embodiment enables the distribution of four bits of the code word in a mapping matrix and makes it possible especially to use an error-correcting code of a (8,4,4) Hamming block type or (8,4,4) Hamming convolutive code type.

According to another particular embodiment of the invention, the mapping step distributes at least eight bits $(c_0, c_1, c_2, \ldots c_7)$ forming the code word c in a mapping matrix A and comprises the following sub-steps:
- mapping according to the Gray mapping of the pairs $(c_2, c_3)$, $(c_4, c_5)$ and $(c_6, c_7)$ delivering a triplet of complex symbols $(s_0, s_1, s_2)$;
- mapping of the pair $(c_0, c_1)$ in inserting the complex number 0 in place $(2c_0+1)$ in the triplet of complex symbols delivering a quadruplet of complex symbols;
- distribution of the complex symbols of the quadruplet in an invertible mapping matrix A.

Thus, according to this embodiment, the chosen mapping makes it possible especially to distribute eight bits of the code word in a mapping matrix and to use for example a Golay convolutive code type of error-correcting code.

Furthermore, according to this embodiment, the mapping matrices can be built, and not selected from a known set, in order to be invertible, and to comply with the criterion of uniqueness of the cancellation of the syndrome associated with the code word.

According to one particular aspect of an embodiment of the invention, which generalizes the application of the embodiment described here above, the mapping step furthermore comprises n steps for distributing at least eight bits forming the code word c, respectively in at least n mapping matrices $A_n$, with n being a non-zero integer and the transmission method comprising a step for computing an overall mapping matrix to be sent corresponding to the sum $$A + \sum_{i=1}^{n} \frac{A_i}{2^i}.$$

Thus, according to the type of mapping chosen, and therefore according to the mapping matrices selected or built, the mapping step enables the distribution of sixteen bits of the code word in a single mapping matrix, or even twenty-four or thirty-two bits.

An embodiment of the invention also pertains to a device for sending a source binary sequence comprising at least one source word x, in a transmission channel.

According to an embodiment of the invention, such a device implements, for at least one source word:
  means for the error-correcting encoding of the source word x delivering a code word c;
  means for distributing bits forming the code word c in at least two matrices called mapping matrices, invertible and complying with a criterion of uniqueness of the cancellation of the syndrome associated with the code word c, said means of distribution being called matrix mapping means;
  means for successively sending said at least two mapping matrices.

According to an embodiment of the invention, a device of this kind is especially suited to implementing the sending method described here above.

This device for sending could of course comprise the different characteristics of the method for sending according to an embodiment of the invention. Thus, the characteristics and advantages of this device are the same as those of the method for sending, and are not described in more ample detail.

Another aspect of an embodiment of the invention pertains to a method for receiving a binary sequence sent, after passage of the binary sequence sent in a transmission channel, delivering a rebuilt binary sequence comprising at least one rebuilt word, the binary sequence sent being obtained from a binary sequence comprising at least one source word x having undergone the following steps before sending, for at least one source word x:
  error-correcting encoding of the source word x delivering a code word c;
  distribution of the bits forming the code word c in at least two matrices called mapping matrices, invertible and complying with a criterion of uniqueness of cancellation of the syndrome associated with the code word c, said step of distribution being called a matrix mapping step;
  successive sending of said at least two mapping matrices.

According to an embodiment of the invention, such a method for receiving comprises the following steps for at least two matrices received:
  identifying at least two invertible decoding matrices with complex coefficients enabling compliance with a criterion of minimization of the norm of the syndrome associated with the code word c;
  determining the rebuilt word from the identified decoding matrices.

Thus, an embodiment of the invention relies on a novel and inventive approach to the reception and decoding of data sent in a channel having undergone processing at sending as described here above with reference to the method for sending according to an embodiment of the invention, enabling the code sent to be rebuilt more efficiently than in the prior art, while at the same time removing the need for knowledge of the channel.

Indeed, since the two matrices sent according to the method for sending being chosen to be invertible and complying with the criterion of uniqueness of the cancellation of the syndrome associated with the code word c, the method for receiving according to an embodiment of the invention includes finding the unique pair of decoding matrices ($M_a$, $M_b$) minimizing the norm of the syndrome associated with the code word c, from among the set of possible pairs ($M_a$, $M_b$) corresponding to the possible code words c sent.

Since the matrices $M_\alpha$ and $M_\beta$ sent result from the redundant encoding according to the error-correcting code chosen when sending and from the mapping in a set of invertible matrices, the search for minimizing the syndrome associated with the code word c is implemented on all the possible code words c and therefore on all the possible source words x which have ($M_a$, $M_b$)(x) as their images. An embodiment of the invention thus enables the rebuilding of the source word x.

According to one embodiment of the invention, the criterion of minimization of the norm of the syndrome associated with the code word c is written as follows, for two received matrices Y(t) and Y(t+1) and two decoding matrices $M_a$ and $M_b$:

$$(\hat{M}_a, \hat{M}_b) = \text{Arg} \min_{(M_a, M_b)} \|Y(t) \cdot M_a^{-1} - Y(t+1) \cdot M_b^{-1}\|,$$

where $\|.\|$ represents the norm of a matrix.

The norm of a matrix may be for example the Frobenius norm denoted as $\|.\|_F$, corresponding to the sum of the moduli of each of the coefficients of the matrix.

According to one particular aspect of an embodiment of the invention, the method for receiving comprises prior to the step for determining the rebuilt word, the following steps for an error-correcting code implementing a convolutive code represented as a trellis:
  determining the metrics of the branches of the sections of the trellis of the convolutive code, each branch being labeled by one of the decoding matrices;
  implementing the Viterbi decoding algorithm from the branch metrics, delivering state metrics.

Thus, an embodiment of the invention provides for a particular computation of the branch metrics of the trellis sections of a representation of a convolutive type error-correcting code taking account of the decoding matrices in order to then apply the Viterbi decoding algorithm in a classic manner.

The use of a such a convolutive error-correcting code enables the production in series of sequences of packets of bits in the form of code words undergoing steps of the method for sending according to an embodiment of the invention as described here above and therefore increasing the correcting capacity in considering the transmission channel to be a continuous sequence while minimizing the complexity at reception and decoding.

In particular, a metric $\gamma_t(M_b)$ of one of the branches labeled by a decoding matrix $M_b$ is determined by the following equation, for three matrices received Y(t−1), Y(t) and Y(t+1) and three decoding matrices $M_a$, $M_b$ and $M_c$:

$$\gamma_t(M_b) = \min_{(M_a, M_c)} \lambda \|Y(t-1) \cdot M_a^{-1} - 2Y(t) \cdot M_b^{-1} + Y(t+1) \cdot M_c^{-1}\| +$$

$$\mu \|Y(t) - \hat{H}'(t) \cdot M_b\|,$$

where λ and μ are adaptive weighting coefficients and $\hat{H}'(t)$ is an estimate of the channel matrix after convergence of the Viterbi decoding algorithm such that:

$$\hat{H}'(t)=(Y(t-1)\cdot M_a^{-1}+Y(t)\cdot M_b^{-1}+Y(t+1)\cdot M_c^{-1})/3.$$

Thus, to compute a metric of the branch labeled by a decoding matrix $M_b$, it is sought to minimize the syndrome on three elements, in the form of a second derivative of the syndrome described here above with, in addition, weighting coefficients λ and μ used to merge the prior-art criterion of minimization of the variation of the channel and the criterion of the Euclidean distance between the received signal and the signals possibly sent, the channel matrix being known.

Another aspect of an embodiment of the invention pertains to a device for receiving a binary sequence sent, after passage of the binary sequence sent in a transmission channel, delivering a rebuilt binary sequence comprising at least one rebuilt word, the binary sequence sent being obtained from a binary sequence comprising at least one source word x, for which the following have been implemented before transmission:

means for the error-correcting encoding of the source word x, delivering a code word c;
  means for distributing bits forming the code word c in at least two matrices called mapping matrices, invertible and complying with a criterion of uniqueness of the cancellation of the syndrome associated with the code word c, said distribution means being called matrix mapping means;
  means for the successive sending of the at least two mapping matrices.

According to an embodiment of the invention, the device for receiving comprises, for at least two matrices received:

means for identifying at least two invertible decoding coefficients with complex coefficients enabling compliance with a criterion of minimization of the norm of the syndrome associated with the code word c;
  means for determining the rebuilt word from the identified decoding matrices.

According to an embodiment of the invention, such a device is especially suited to implementing the method for receiving described here above.

This device for receiving could of course comprise the different characteristics pertaining to the method for receiving according to an embodiment of the invention. Thus, the characteristics and advantages of this device are the same as those of the method for receiving, and are not described in greater detail.

An embodiment of the invention also pertains to a computer program product downloadable from a communications network and/or recorded on a computer-readable carrier and/or executable by a processor, comprising program code instructions for the implementing of the method for sending or the method for receiving as described here above.

The methods for sending and receiving according to an embodiment of the invention can therefore be implemented in different ways, and especially in wired form or software form.

BRIEF DESCRIPTION OF THE DRAWINGS

Other features and advantages shall appear more clearly from the following description of a particular embodiment, given by way of a simple illustrative and non-exhaustive example and from the appended drawings, of which.

DETAILED DESCRIPTION OF ILLUSTRATIVE EMBODIMENTS

1. General Principle

The general principle of an embodiment of the invention relies on a novel matrix encoded modulation or matrix coded modulation, denoted as MCM, enabling adaptation to the matrix modeling with complex coefficients of the multiple antenna transmission channel or MIMO, combined with an error-correcting encoding function.

An embodiment of the invention relies more particularly on the invertibility of the matrices used for the modulation, making it possible to overcome the constraint by which the channel is assumed to be constant by blocks.

Indeed, an embodiment of the invention assumes only that the channel is weakly variant, in a continuous manner, and this is a hypothesis that complies with the reality of the radio-electrical channels used in practice, especially for mobile transmissions.

The novel matrix encoded modulation according to an embodiment of the invention uses subsets of invertible matrices with coefficients taken from an infinity of algebraic structures, fields or rings such as for example complex numbers, Hamilton numbers and hypercomplex Cayley numbers, etc.

An embodiment of the invention can work without knowledge of the channel (the non-coherent case also known as the "blind" case) or with total or partial knowledge of the channel (called the "semi-blind" state) and is therefore more robust and performs better than the differential encoding techniques classically used in the MIMO systems, in terms of bit rate and/or quality of service for clients (higher data bit rate or lower error rate and/or greater range of the transmitters).

Figure 1:
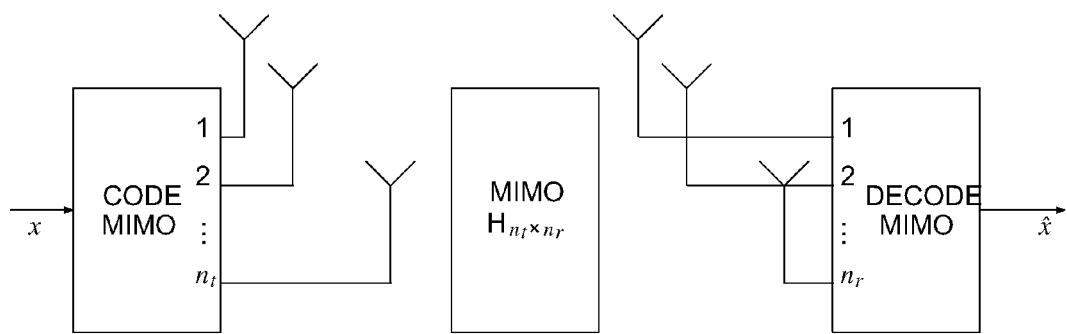
FIG. 1, already described with reference to the prior art, presents the general scheme of a MIMO transmission system.
Figure 2:
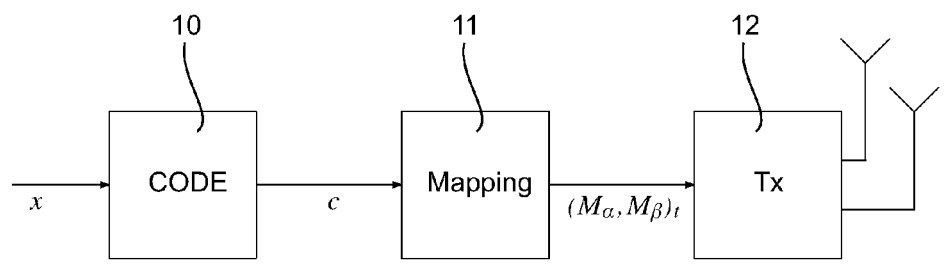
FIG. 2 illustrates the main steps of the method for sending according to one embodiment of the invention.

FIG. 2 illustrates the main steps of implementation on the sending side, for a source word x to be transmitted.

A method for sending of this kind implements a step 10 of error-correcting encoding delivering a code word c associated with the source word x.

This step of error-correcting encoding enables the encoding of the information bits of the source binary sequence formed by at least one source word x, in using at least one error-correcting code. We thus obtain at least one code word c at output of this step 10 which comprises both information bits and redundancy bits.

This error-correcting encoding may be of different types, depending on the embodiments of the invention, such as for example block encoding or convolutive encoding, turbo-encoding, etc.

A mapping step 11, which is a matrix mapping step, is then implemented, distributing the bits of the code word c in at least two invertible mapping matrices $M_\alpha$ and $M_\beta$, and complying with the criterion of uniqueness of the cancellation of the syndrome associated with the code word c.

This mapping step enables the bits of the code word c to be distributed so as to obtain at least two matrices known as mapping matrices, which are particular matrices carrying payload information of the source word x. The particular features of these matrices are, on the one hand, their invertibility and, on the other hand, compliance with the criterion of uniqueness of the cancellation of the syndrome associated with the code word c.

As described in the Appendix A, forming an integral part of the description, the property of invertibility of these mapping matrices makes it possible to obtain an estimation of the channel and therefore to do away with the need for knowledge of the channel.

Furthermore, as also described in Appendix A, the characteristics of compliance with a criterion of uniqueness of the cancellation of the syndrome makes it possible to ensure that a unique code word corresponding to a unique pair of mapping matrices, cancels the syndrome and therefore enables high-performance decoding of the received matrices.

Once the mapping matrices have been generated, at the mapping step 11, they are sent successively by the nt sending antennas at a step 12, after multiplexing as the case may be.

Figure 8:
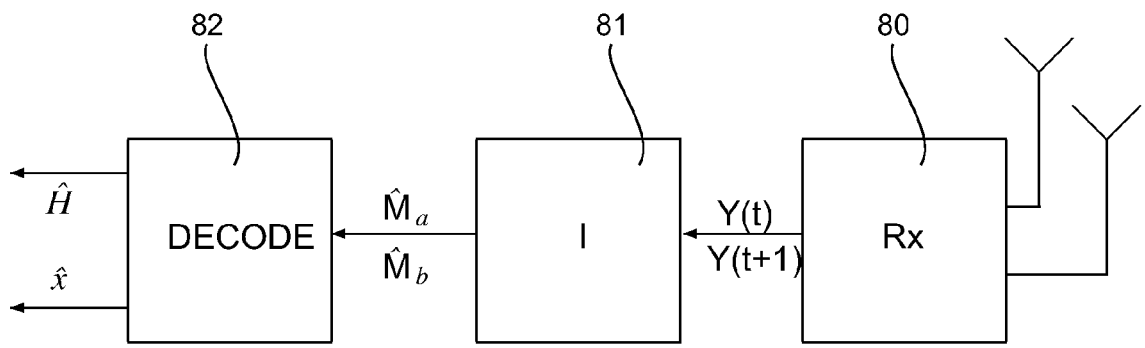
FIG. 8 illustrates the main steps of the method for receiving according to one embodiment of the invention.

On the reception side, the main steps are illustrated in FIG. 8.

After a first step 80 for the receiving of at least two matrices Y(t) and Y(t+1), by the nr receiving antennas, the method for receiving implements a step 81 for identifying at least two invertible decoding matrices with complex coefficients denoted as $(\hat{M}_a, \hat{M}_b)$. This identification step takes account especially of a criterion for minimizing the norm of the syndrome associated with the code word c delivered on the receiving side by the implementation of an error-correcting code as already described here above. This criterion must be complied with by the identified decoding matrices and is written as follows:

$$(\hat{M}_a, \hat{M}_b) = \text{Arg} \min_{(M_a, M_b)} \|Y(t) \cdot M_a^{-1} - Y(t+1) \cdot M_b^{-1}\|.$$

(equation (8) of Appendix A)

As already indicated here above, the matrices sent are selected in such a way that a unique pair $(\hat{M}_a, \hat{M}_b)$ of decoding matrices enables the syndrome to be minimized.

Thus, since a unique code word is associated with this unique pair of decoding matrices, the method for receiving can rebuild the source word from these decoding matrices during a step 82 for determining the rebuilt word $\hat{x}$, such that:

$$\hat{x} = \text{Arg} \min_{c(x) \in C \to (M_a, M_b)} \|Y_{(t)} M_a^{-1} - Y_{(t+1)} M_b^{-1}\|_F.$$

(equation (9) of Appendix A)

2. Description of a First Example of an Embodiment

Figure 3A:
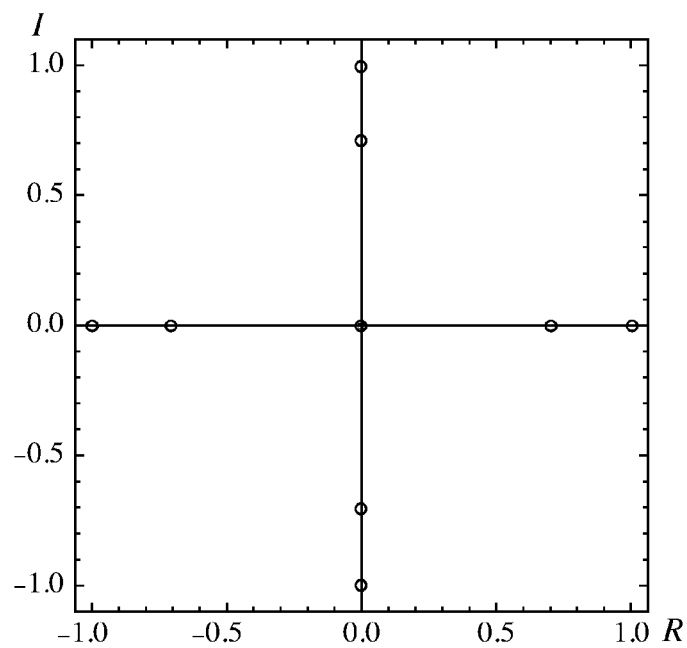
FIGS. 3a and 3b respectively illustrate an example of a constellation resulting from the matrix modulation (with the cosets of the Weyl group) and an example of a system implementing the invention according to a first particular embodiment of the method for sending of the invention.
Figure 3B:
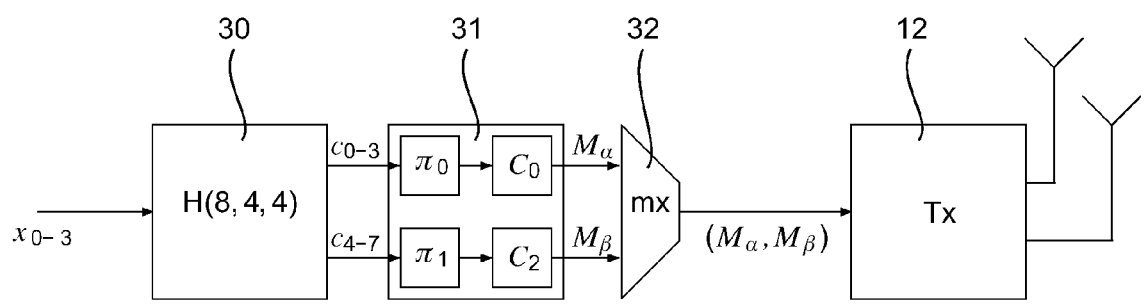

Referring to FIGS. 3a and 3b, a description is provided now of a first example of an embodiment of the invention implementing a 2×2 matrix modulation and a (8,4,4) Hamming block code for a MIMO system comprising two sending antennas and two receiving antennas.

The generating matrix G of the (8,4,4) Hamming (n=8, k=4, $d_{min}$=4) block code, well known to those skilled in the art, is written as follows: G=[$I_4$|P], with P=$\overline{I}_4$, that is:

$$G = \begin{bmatrix} 1 & 0 & 0 & 0 & 1 & 1 & 1 & 1 \\ 0 & 1 & 0 & 0 & 1 & 0 & 1 & 1 \\ 0 & 0 & 1 & 0 & 1 & 1 & 0 & 1 \\ 0 & 0 & 0 & 1 & 1 & 1 & 1 & 0 \end{bmatrix}$$

Furthermore, in this embodiment, the mapping matrices are selected from among the 2×2 matrices with invertible complex coefficients belonging to the Weyl group, denoted as Gw, as described especially in the document by H. Weyl, "*The Classical Groups*", Princeton University Press, Princeton, N.J., USA, 1946.

This Weyl group comprises 192 matrices which could be generated by a highly simple method described in the document by F. J. MacWilliams and N. J. A. Sloane, "*The theory of error-correcting codes*", North-Holland, Amsterdam, 1977, chapter 19, paragraph 3.

Indeed, the group Gw can be broken up into 12 cosets or lateral classes denoted as Ck with k=0, 1, . . . , 11.

The coset C0 is the sub-group of 16 matrices such that: $C_k = \alpha_k \cdot C_0$, $\forall k=0, 1, \ldots, 11$, with the matrices $\alpha_0$, $\alpha_5$, . . . , $\alpha_5$ such that:

$$a_0 = \begin{bmatrix} 1 & 0 \\ 0 & 0 \end{bmatrix},$$

$$a_1 = \begin{bmatrix} 1 & 0 \\ 0 & i \end{bmatrix},$$

$$a_2 = \frac{1}{\sqrt{2}} \begin{bmatrix} 1 & 1 \\ 1 & -1 \end{bmatrix},$$

$$a_3 = \frac{1}{\sqrt{2}} \begin{bmatrix} 1 & 1 \\ i & -i \end{bmatrix},$$

$$a_4 = \frac{1}{\sqrt{2}} \begin{bmatrix} 1 & i \\ 1 & -i \end{bmatrix},$$

$$a_5 = \frac{1}{\sqrt{2}} \begin{bmatrix} 1 & i \\ i & 1 \end{bmatrix},$$

and the matrices $\alpha_6, \alpha_7, \ldots, \alpha_{11}$ such that:

$$a_{k+6} = \eta a_k,$$

with $$\eta = \frac{1+i}{\sqrt{2}},$$

$$\forall k = 0, 1, \ldots, 5.$$

According to this embodiment, the matrices can for example be selected in the cosets C0 and C2 of the Weyl group in order to comply with the criterion of uniqueness of the cancellation of the syndrome for pairs of matrices belonging to these cosets. According to another example, the matrices can for example be selected in the cosets C1 and C8 of the Weyl group, always in order to comply with the criterion of uniqueness of the cancellation of the syndrome.

FIG. 3a illustrates the resultant constellation of a matrix encoded modulation according to an embodiment of the invention, with mapping matrices selected in the cosets C0 and C2 of the Weyl group.

FIG. 3b illustrates the main steps implemented when sending in this embodiment of the invention.

From the source word $x=(x_0, x_1, x_2, x_3)$, carrying payload information, a first step 30 of error-correcting encoding applies the Hamming block code described here above to the source word x and delivers a code word $c=x \cdot G$, with $c=(c_0, c_1, c_2, c_3, c_4, c_5, c_6, c_7)$.

As indicated here above, at a mapping step 31, the two mapping matrices to be transmitted $M_\alpha$ and $M_\beta$ respectively are selected in the cosets C0 and C2 of the Weyl group after application of the two permutations to the bits of the code c mode.

For example, with the first four bits $c_{0-3}=(c_0, c_1, c_2, c_3)$ permutated by the identity permutation denoted as $\pi_0$, the corresponding matrix $M_\alpha$ is selected in the coset C0 and with the last four bits $c_{4-7}=(c_4, c_5, c_6, c_7)$ permutated according to a permutation $\pi_1$, such that (0,1,2,3) gives (0,3,2,1), the corresponding matrix $M_\beta$ is selected in the coset C2.

At the end of the mapping step 31, the two mapping matrices to be transmitted $M_\alpha$ and $M_\beta$ are multiplexed at a multiplexing mx step 32 and then sent successively at a step 12.

On the reception side, and as already described here above, the decoding algorithm according to an embodiment of the invention will therefore consist in finding the unique pair $(M_a, M_b)$ of decoding matrices corresponding to the code word c that minimizes the norm of the syndrome (see equation 8 of Appendix A).

Since the matrices $M_\alpha$ and $M_\beta$ sent result from the redundant encoding according to the (8,4,4) Hamming block code and the mapping of the code word in a set of invertible matrices taken respectively in the cosets C0 and C2 of the Weyl group, the syndrome is minimized on all the possible code words c and therefore on all the possible payload information words x which have as images $(M_a, M_b)(x)$.

Thus, the code mode can be rebuilt from the matrices received as follows:

(equation (9) of Appendix A)

$$\hat{x} = Arg \min_{c(x) \in C \to (M_a, M_b)} \|Y_{(t)} M_a^{-1} - Y_{(t+1)} M_b^{-1}\|_F.$$

According to this particular embodiment, the set of possible code words comprises 16 code words, giving 16 pairs of possible matrices. An exhaustive search among these 16 pairs of matrices makes it possible to identify that one which minimizes the norm of the syndrome, and then makes it possible to determine the associated code word, and therefore to rebuild the source word.

3. Description of a Second Embodiment

Figure 4:
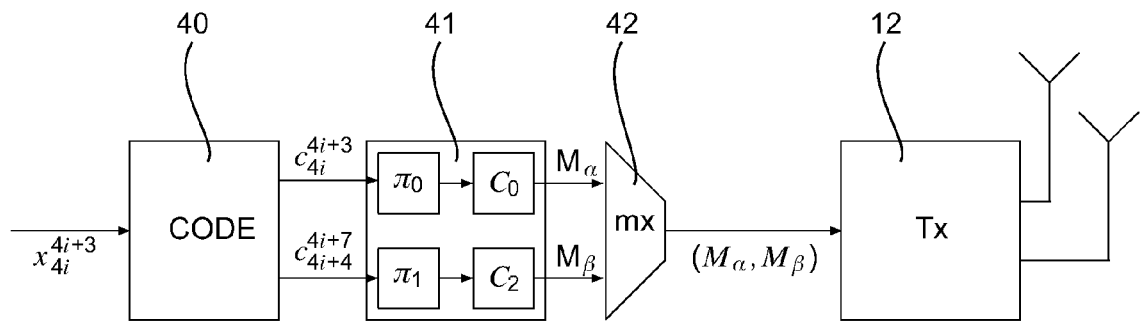
FIG. 4 illustrates an example of a system implementing the invention according to a second particular embodiment (for the case of a code described by at least one trellis as a convolutive code or a turbo-code) of the method for sending of FIG. 2.
Figure 5A:
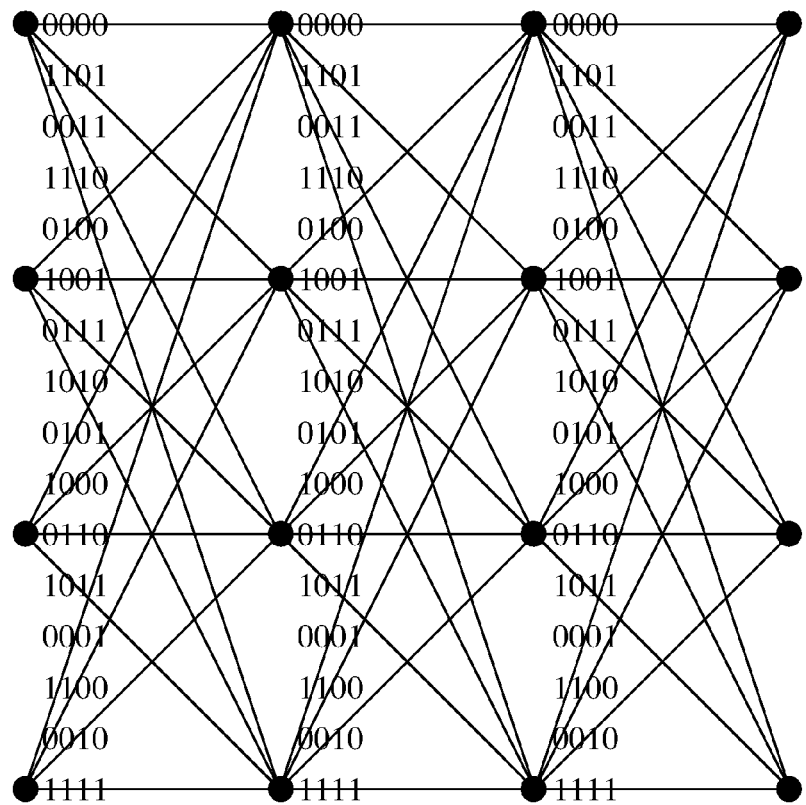
FIGS. 5a and 5b respectively present a representation of three 4-state trellis sections of the (8,4,4) Hamming convolutive code and a representation of a part of the trellis for the computation of the branch metrics according to a second particular embodiment (for a code described by at least one trellis as a convolutive code) of the method for sending of the invention.
Figure 5B:
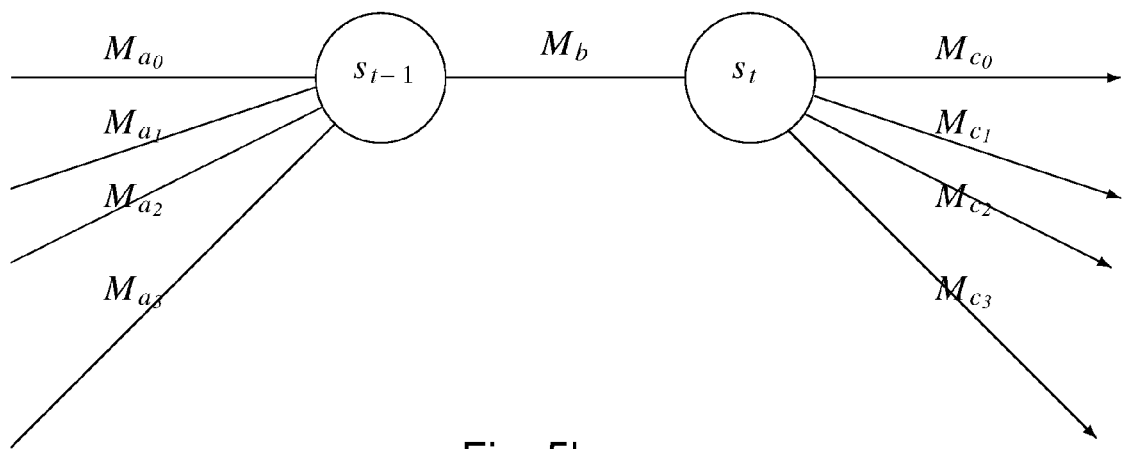

Referring to FIGS. 4, 5a and 5b, a description is now given of a second example of an embodiment of the invention implementing a 2×2 matrix modulation and a convolutive error-correcting code deduced from the (8,4,4) Hamming block code in unfolding and repeating its 4-state tail-biting trellis to infinity, for a MIMO system comprising two sending antennas and two receiving antennas.

This convolutive code known as a Hamming code is built from the trellis known as the "tail-biting" trellis or circular trellis of the Hamming block code described here above.

This small convolutive code, the trellis of which is very simple, as shown in FIG. 5a for a 4-state trellis with three sections, enables the principle of this embodiment to then be extended to all the codes capable of including one or more trellises in their description such as for example the turbo-codes described especially in the document by Claude Berrou and al., "*Codes and turbocodes*", Springer, IRIS Collection, 2007, or in the document by J. N. Pillai, S. H. Mneney, "*A review on issues related to the implementation of turbo-codes and space-time trellis codes*", AFRICON, 2004. 7th AFRICON Conference in Africa Volume: 1 Publication Year: 2004, Page(s): 121-126, Vol. 1.

The packets $(c_i, c_{i+1}, c_{i+2}, \ldots c_{i+\delta})$ of $(\delta+1)$ bits are denoted as $c_i^{i+\delta}$.

As illustrated in FIG. 4, the principle when sending is the same as for the previous embodiment, implementing a block encoding except that the payload information bits of the source word x are presented by four-bit packets $x_{4i}^{4i+3}$ in series. The encoding step 40 encodes these bits according to the convolutive code described here above and produces sequences of pairs of four-bit packets $(c_{4i}^{4i+3}, c_{4i}^{4i+7})$, where the relative integer i is the order number of the four-bit packet.

Thus, from a payload information packet $x_{4i}^{4i+3}$, we obtain after encoding a pair of packets $(c_{4i}^{4i+3}, c_{4i+4}^{4i+7})$.

Then, at a mapping step 41, the two mapping matrices to be transmitted $M_\alpha$ and $M_\beta$ respectively are selected in the coset C0 and the coset C2 of the Weyl group after two permutations have been applied to the bits of the code word c.

For example, with the first four bits $c_{4i}^{4i+3}$ permutated by the permutation $\pi_0$, the corresponding matrix $M_\alpha$ is selected in the coset C0, and with the last four bits $c_{4i+4}^{4i+7}$ permutated according to a permutation $\pi_1$, the corresponding matrix $M_\beta$ is selected in the coset C2.

At the end of the mapping step 41, the two mapping matrices to be transmitted $M_\alpha$ and $M_\beta$ are multiplexed at a multiplexing step mx 42 and then sent successively at a step 12. On the reception side, the received signals are 2×2 matrices denoted $Y_t$ and $Y_{t+1}$.

The branches of the trellis representing the error-correcting code are labeled by four-bit packets associated bijectively with the mapping matrices determined when sending. As illustrated in FIG. 5b, the branches of the trellis can then be considered to be labeled by matrices $(M_a, M_b, M_c, \ldots)$, which, being well-identified for successive sections, make it possible to obtain a uniqueness of the syndrome as for the previous embodiment with a block encoding.

At a first stage, the invention in this embodiment provides for a specific computation of the branch metrics $\gamma_t$, then needed for the application, in a second stage, of the Viterbi decoding algorithm (classically used for a convolutive error-correcting code).

Thus, for example, the values of metrics $\gamma_t(M_b)$ corresponding to the path metrics passing through the branch with the matrix $M_b$ label for the instant t, are computed as follows, for three matrices received Y(t−1), Y(t) and Y(t+1) and three decoding matrices $M_a$, $M_b$ and $M_c$:

$$\gamma_t(M_b) = \min_{(M_a, M_c)} \lambda \| Y(t-1) \cdot M_a^{-1} - 2Y(t) \cdot M_b^{-1} + Y(t+1) \cdot M_c^{-1} \| + \mu \| Y(t) - \hat{H}'(t) \cdot M_b \|,$$

where $\lambda$ and $\mu$ are adaptive weighting coefficients and $\hat{H}'(t)$ is an estimate of the channel matrix after convergence of the Viterbi decoding algorithm such that:

$$\hat{H}'(t) = (Y(t-1)/M_a^{-1} + Y(t) \cdot M_b^{-1} + Y(t+1) \cdot M_c^{-1})/3.$$

It must be noted that the weighting coefficients $\lambda$ and $\mu$ make it possible to merge the prior-art criterion of minimization of the variation of the channel and the criterion of the Euclidean distance between the received signal and the signals possibly sent, the channel matrix being known.

As illustrated in FIG. 5b, the pairs $(M_a, M_c)$ are the pairs of matrices respectively labeling the incoming branches of the state $s_{t-1}$ and the outgoing branches of the state $s_t$, situated on either side of the branch labeled by $M_b$.

The estimates $\hat{H}(t)$ of the channel matrices associated with each of these branches of each section of the trellis are written as: $\hat{H}_t(M_b) = Y_t \cdot M_b^{-1}$.

From these values of metrics computed according to an embodiment of the invention, the Viterbi algorithm then consists, in a known way, in computing the state metrics $\Gamma(s_t)$ such that:

$$\Gamma(s_t) = \min_{M_b}(\Gamma(s_{t-1}) + \gamma_t(M_b))$$

The weighting coefficients $\lambda$ and $\mu$ are considered for example to be respectively equal to 1 and 0 at the first iteration.

If we consider two successive sections, and a filter for estimating the variation of the channel comprising two filtering coefficients respectively equal to 1 and −1, the values of metrics $\gamma_t(M_b)$ corresponding to the path metrics passing through the branch with the matrix $M_b$ are written as follows:

$$\gamma_t(M_b) = \min_{(M_a)} \| Y_{t-1} M_a^{-1} - Y_t M_b^{-1} \|.$$

These numerical filtering coefficients are classic for estimating the 1, 2, 3, . . . order derivatives and therefore for estimating the window of invariance of a sampled digital signal.

If we now consider three successive sections and a filter for estimating the variation of the channel comprising three filtering coefficients respectively equal to 1, −2 and 1, the values of metrics $\gamma_t(M_b)$ corresponding to the path metrics passing through the branch with the matrix $M_b$ label are written as follows:

$$\gamma_t(M_b) = \min_{(M_a, M_c)} \| Y_{t-1} M_a^{-1} - 2Y_t M_b^{-1} + Y_{t+1} M_c^{-1} \|$$

It must be noted that this last-named case with a filter for estimating the variation of the three-coefficient channel corresponds to one of the simplest embodiments while at the same time performing very well.

If we consider four successive sections, and a filter for estimating the variation of the channel comprising four coefficients respectively equal to 1, −3, +3 and −1, the values of metrics $\gamma_t(M_b)$ corresponding to the path metrics passing through the branch with the branch with the matrix $M_b$ label are written as follows:

$$\gamma_t(M_b) = \min_{(M_a, M_c, M_d)} \| Y(t-1) \cdot M_a^{-1} - 3Y(t) \cdot M_b^{-1} + 3Y(t+1) \cdot M_c^{-1} - Y(t+2) \cdot M_d^{-1} \|$$

Finally, if we consider five successive sections and a filter for estimating the variation of the channel comprising five coefficients respectively equal to 1, −4, 6, −4 and 1, the values of metrics $\gamma_t(M_b)$ corresponding to the path metrics passing through the branch with the matrix $M_b$ label are written as follows:

$$\gamma_t(M_c) = \min_{(M_a, M_b, M_d, M_e)} \| Y_{t-2} M_a^{-1} - 4Y_{t-1} M_b^{-1} + 6Y_t M_c^{-1} - 4Y_{t+1} M_c^{-1} + Y_{t+2} M_d^{-1} \|$$

4. Description of a Third Embodiment

Figure 6A:
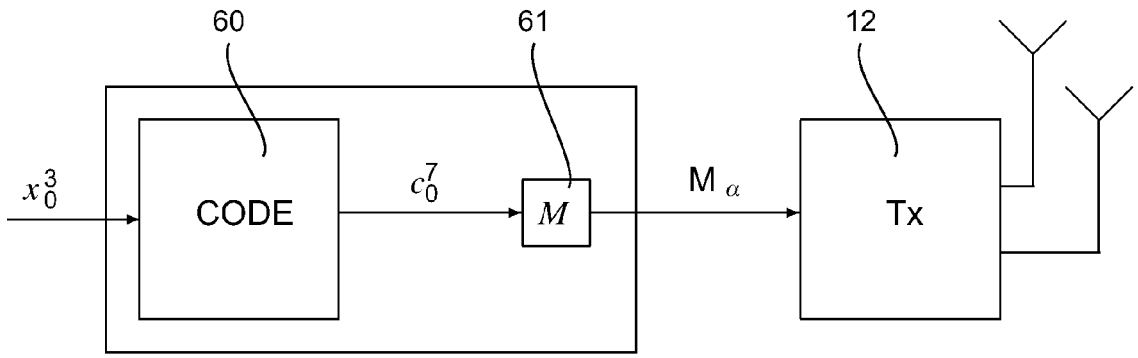
FIGS. 6a and 6b respectively illustrate an example of a system implementing the invention and an example of a constellation resulting from the matrix modulation according to a third particular embodiment of the method for sending according to the invention.
Figure 6B:
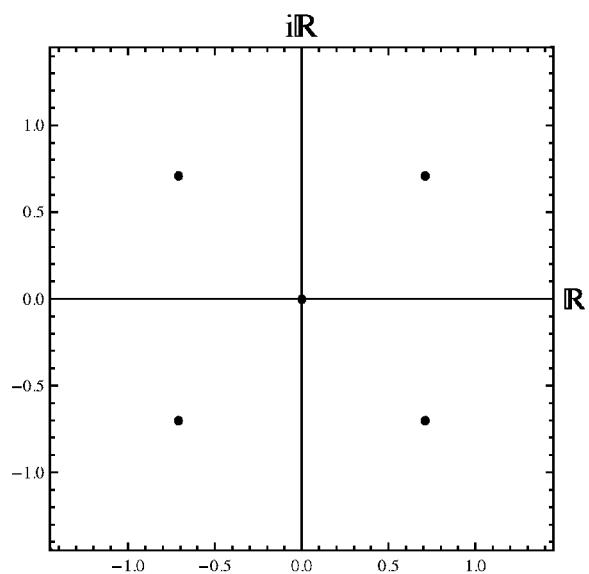
Figure 6C:
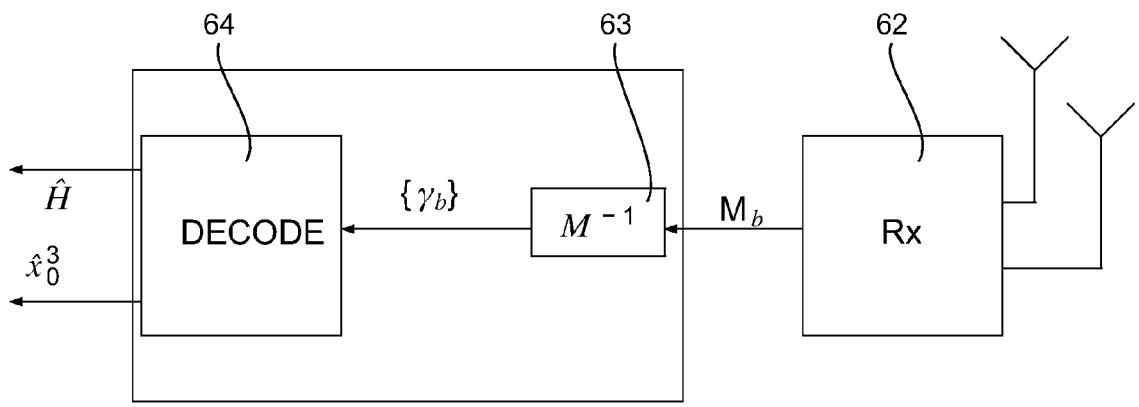
FIG. 6c illustrates an example of a system implementing the invention according to the third particular embodiment of the method for receiving according to the invention.

Referring to FIGS. 6a to 6c, a description is now given of a third example of an embodiment of the invention implementing a 2×2 matrix modulation and a Golay convolutive error-correcting code for a MIMO system comprising two sending antennas and two receiving antennas.

According to this embodiment, the mapping matrices are no longer selected in the Weyl group but built so as to comply with the properties required by an embodiment of the invention, namely invertibility and compliance with the criterion of uniqueness of the cancellation of the syndrome.

Thus, as illustrated in FIG. 6a from a sliding window of four bits $x_0^3 = (x_0, x_1, x_2, x_3)$ of information to be transmitted, the step 60 of convolutive encoding produces eight bits $c_0^7 = (c_0, c_1, c_2, \ldots c_7)$.

The code used is for example the convolutive Golay code described in E. Cadic, J. C. Carlach, G. Olocco, A. Otmani and J. P. Tillich, "*Low Complexity Tail-Biting Trellises of Self-Dual Codes of Length* 24, 32 *and* 40 *over GF*(4) *and* Z4 *of Large Minimum Distance*", In Proceedings of the 14th International Symposium on Applied Algebra, Algebraic Algorithms and Error-Correcting Codes (AAECC '14), Melbourne (Australia), S. Boztas and I. Shparlinski (Eds.), Ed. Springer Verlag, pp. 57-66, November 2001.

At a mapping step 61, the six bits $c_2^7 = (c_2, \ldots c_7)$ are grouped together in three pairs $(c_2, c_3)$, $(c_4, c_5)$ and $(c_6, c_7)$, each mapped according to the Gray mapping, to obtain a triplet of complex symbols $(s_0, s_1, s_2)$ such that:

(0,0) ⇔ +1+$i$
(0,1) ⇔ −1+$i$
(1,1) ⇔ −1−$i$
(1,0) ⇔ +1−$i$ with $\mathcal{I}$ the pure imaginary complex number such that $\mathcal{I}^2 = -1$.

The first two bits ($c_0$, $c_1$) are mapped by inserting the complex number 0 in place ($2c_0+1$) in the triplet of complex symbols obtained above to obtain a quadruplet of complex symbols then converted into a 2×2 matrix $M_\alpha$ such that:

$$(0, 0) \Leftrightarrow (0, s_0, s_1, s_2) \Leftrightarrow \begin{pmatrix} 0 & s_0 \\ s_1 & s_2 \end{pmatrix}$$

$$(0, 1) \Leftrightarrow (s_0, 0, s_1, s_2) \Leftrightarrow \begin{pmatrix} s_0 & 0 \\ s_1 & s_2 \end{pmatrix}$$

$$(1, 0) \Leftrightarrow (s_0, s_1, 0, s_2) \Leftrightarrow \begin{pmatrix} s_0 & s_1 \\ 0 & s_2 \end{pmatrix}$$

$$(1, 1) \Leftrightarrow (s_0, s_1, s_2, 0) \Leftrightarrow \begin{pmatrix} s_0 & s_1 \\ s_2 & 0 \end{pmatrix}$$

It can be noted that these matrices comply with the criteria necessary for implementing an embodiment of the invention. They are indeed invertible, each corresponding to one and only one combination of eight bits and making it possible to obtain a modulation for which the constellation is illustrated in FIG. 6*b*.

It must be noted that these matrices can be multiplied by a constant without compromising these criteria. The constant can for example be $1/\sqrt{2}$ in order to standardize these matrices.

These steps are implemented for the following information bits to be transmitted so as to obtain at least one other mapping matrix $M_\beta$.

The payload information packets arrive by four-bit sliding windows and are then encoded to produce eight encoded bits. An eight-bit encoded packet is therefore mapped as described here above to produce a 2×2 invertible matrix with complex coefficients. Since the convolutive Golay code has a minimum 16-state trellis, the two four-bit packets preceding and following the packet of the section are encoded in two eight-bit packets preceding and following the current eight-bit packet. This encoding relationship makes it possible, after mapping, to obtain three successive invertible matrices sent, having indices (t−1), t and (t+1) for which there is also a uniqueness of the syndrome on the trellis of the convolutive code.

As in the case of the embodiments described here above, these mapping matrices are transmitted successively during a step 12.

On the reception side, the decoding is done in the same way as for the embodiment using a convolutive Hamming code.

As already described in this embodiment, the invention provides for a new computation of the branch metrics making it possible especially to use the code to directly "map" a sequence of payload information windows and a sequence of invertible matrices.

FIG. 6*c* illustrates the main steps of the method for receiving according to this embodiment of the invention.

The first step for receiving 62 consists in receiving at least two matrices Y(t) and Y(t+1) and identifying at least two invertible decoding matrices that comply with the criterion of minimization of the norm of the syndrome associated with the code word c generated when sending.

The metric computing step 63 carries out the specific computing of the branch metrics from at least one decoding matrix $M_b$, so as to deliver at least one metric $\gamma_t(M_b)$ used in the Viterbi decoding algorithm at the step 64 for decoding by detection on the trellis of the code.

At the end of this step 64, an estimate $\hat{x}_0^3$ is obtained of the source word x sent as well as an estimate $\hat{H}$ of the channel.

5. Description of a Fourth Embodiment

As already indicated here above, in a fourth embodiment, the invention enables the transmission of 16 encoded bits $c_{0-15}$.

To this end, an embodiment of the invention uses a modulation close to the MAQ16 modulation where the first level is mapped towards ($\pm 1 \pm \mathcal{I}$) as for the previous embodiment and the second level towards ($\pm 1 \pm \mathcal{I}$)/2.

According to this embodiment of the invention, the eight first bits are mapped so as to obtain a first invertible matrix A=M ($c_{0-7}$) and the last eight bits $c_{8-15}$ are mapped so as to obtain a second invertible matrix B=M ($c_{8-15}$).

Figure 7A:
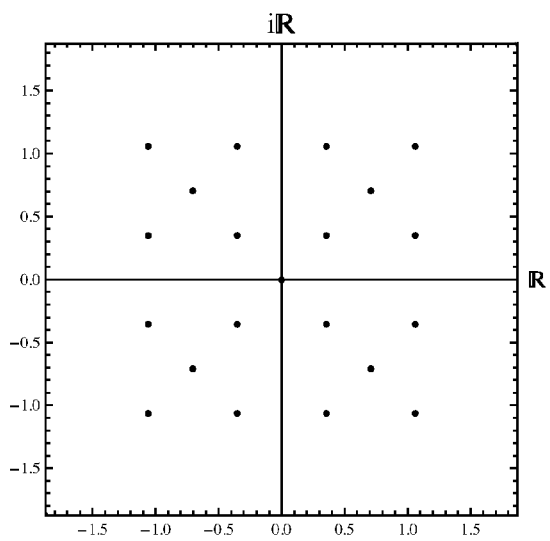
FIGS. 7a to 7c respectively illustrate an example of a constellation resulting from the matrix modulation according to a fourth, fifth and sixth embodiment of the method for sending of the invention.

The overall mapping matrix obtained corresponds to the sum (A+B/2) which is an invertible matrix with complex coefficients, the constellation of which is shown in FIG. 7*a*.

The other steps when sending and then receiving are identical to the third embodiment described here above.

6. Description of Fifth Embodiment

An embodiment of the invention also makes it possible, in this fifth embodiment, to transmit 24 encoded bits $c_{0-23}$.

To this end, an embodiment of the invention uses a different mapping for each of the three groups of eight bits $c_{0-7}$, $c_{8-15}$ and $c_{16-23}$ to obtain three invertible matrices A, B and C.

Figure 7B:
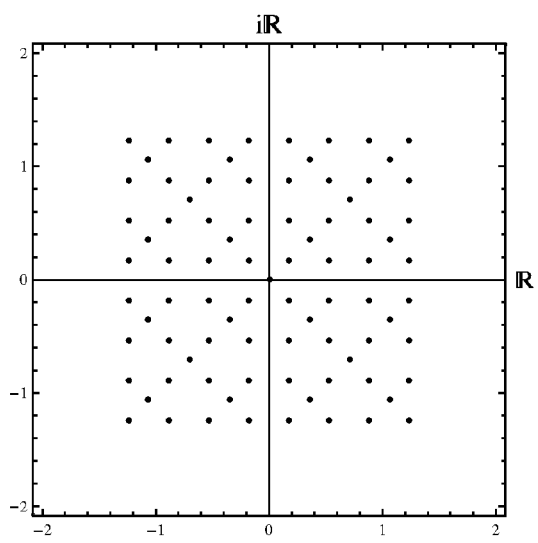

The overall mapping matrix obtained corresponds to the sum (A+B/2+C/4) which is an invertible matrix with complex coefficients, the constellation of which is shown in FIG. 7*b*.

The other steps when sending and then at reception are identical to the third embodiment described here above.

7. Description of a Sixth Embodiment

According to a sixth embodiment, the invention enables the transmission of 32 encoded bits $c_{0-31}$.

To this end, an embodiment of the invention uses a different mapping for each of the four groups of eight bits $c_{0-7}$, $c_{8-15}$, $c_{16-23}$ and $c_{24-31}$, to obtain four invertible matrices A, B, C and D.

Figure 7C:
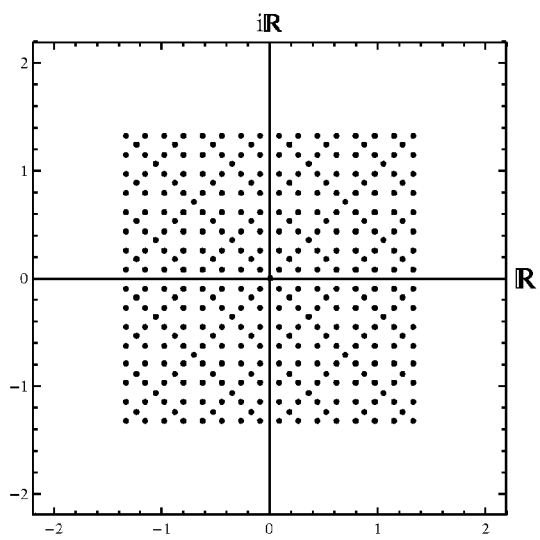

The overall mapping matrix obtained corresponds to the sum (A+B/2+C/4+D/8) which is an invertible matrix with complex coefficients, the constellation of which is shown FIG. 7*c*.

The other steps when sending and then at reception are identical to those of the third embodiment described here above.

8. Other Exemplary Embodiments

The above embodiments can be extended if we consider n mapping matrices $A_n$, with n being a non-zero integer, and an overall mapping matrix to be sent corresponding to the sum $$A + \sum_{i=1}^{n} \frac{A_i}{2^i}.$$

An embodiment of the invention can also be implemented whenever a convolutive code is used, for example for turbo-codes that use at least two convolutive codes separated by a permutation-interlacer.

An embodiment of the invention can also be applied to LDPC (low-density parity check) codes by mapping bits of blocks to invertible matrices.

For the iterative decoding of the LDPC codes and turbo-codes, the propagation of extrinsic information can be done both for payload information symbols and on estimated matrices of the weakly variant channel according to an embodiment of the invention.

An embodiment of the invention has essentially been described in the context of a MIMO channel which, in a cable transmission environment, is said to be of a multi-transmitter and multi-receiver type. An embodiment of the invention can also be implemented in the context of a SISO channel. In this case, the symbols of the matrices are sent successively.

9. Simplified Structure of the Corresponding Sending and Receiving Devices

Figure 9A:
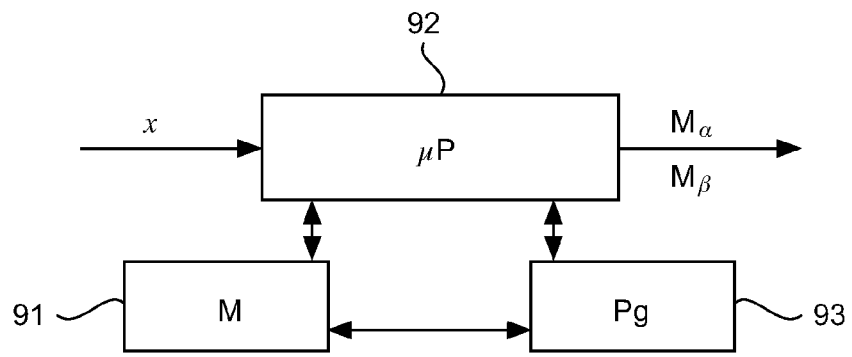
FIGS. 9 and 9b respectively illustrate an example of a device for sending and an example of a device for receiving according to the invention.
Figure 9B:
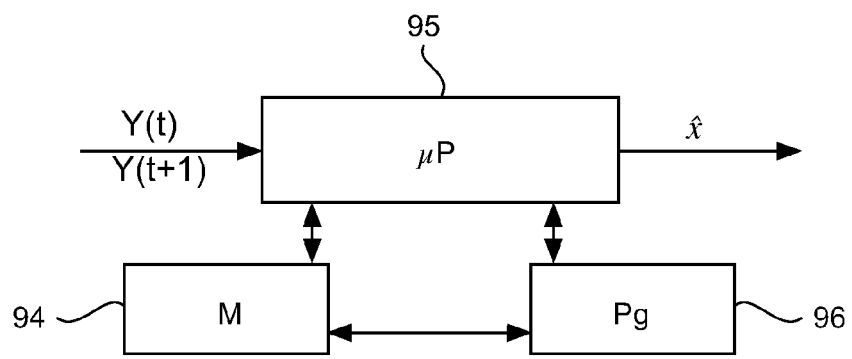

Referring finally to FIGS. 9a and 9b, we present the simplified structure of a device for sending and a device for receiving respectively implementing a technique for sending and a technique for receiving according to one of the examples of embodiments described here above.

Such a device for sending comprises a memory 91, a processing unit 92 equipped for example with a microprocessor μP and driven by the computer software program 93, implementing the method for sending according to an embodiment of the invention.

At initialization, the code instructions of the computer program 93 are loaded for example into a RAM and then executed by the processor of the processing unit 92. The processing unit 92 inputs a source binary sequence x. The microprocessor of the processing unit 92 implements the steps of the method for sending described here above according to the instructions of the computer program 93 to encode and map the source binary sequence and send mapping matrices. To this end, the sending device comprises, in addition to the buffer memory 91, error-correcting encoding means for the source word x, delivering a code word c, matrix mapping means for the code word c, distributing the bits forming the code word c into at least two mapping matrices that are invertible and comply with the criterion of uniqueness of the cancellation of the syndrome associated with the code word c and means for successively sending two mapping matrices. These means are driven by the microprocessor of the processing unit 92.

The processing unit 92 therefore transmits a signal modulated in the form of matrices to a receiver through a transmission channel.

The device for receiving of FIG. 9 comprises, for its part, a memory 94, a processing unit 95 equipped for example with a microprocessor μP and driven by the computer software program 96, implementing the method for receiving according to an embodiment of the invention.

At initialization, the code instructions of the computer program 96 are loaded for example into a RAM and then executed by the processor of the processing unit 95. The processing unit 95 inputs matrices Y(t) and Y(t+1). The microprocessor of the processing unit 95 implements the steps of the processing method described here above according to the instructions of the computer program 96 to identify decoding matrices and rebuild a word $\hat{x}$. To this end, the device for receiving comprises, in addition to the buffer memory 94, means for identifying at least two invertible decoding matrices with complex coefficients enabling compliance with a criterion of minimization of the norm of the syndrome associated with the code word c and means for determining the rebuilt word from the identified decoding matrices. These means are driven by the microprocessor of the processing unit 95.

10. Appendix A

Theoretical Computations of MCM Encoding with the (8,4, 4) Hamming Block Code For each symbol time t, the pair of signals $Y_t=(y_{t,1}, y_{t,2})$ received by the antennas 1 and 2 can be written as a function of the pair of signals sent $X_t=(x_{t,1}, x_{t,2})$ and of the transfer matrix of the $H_t$ such that:

$$y_{t,2} = h_{t,1,2} * x_{t,1} + h_{t,2,2} * x_{t,2} \tag{1}$$

That is, at each discrete symbol instant t: $Y_t = H_t \cdot X_t$

For a pair of even-parity and odd-parity successive symbol times (2t, 2t+1), abbreviated as (t), the two vectors of two signals received by the antennas during these two symbol times can be written such that:

$$Y_{2t} = H_{2t} \cdot X_{2t} + N_{2t} \tag{2}$$

$$Y_{2t+1} = H_{2t+1} \cdot X_{2t+1} + N_{2t+1}$$
$$= H_{2t} \cdot X_{2t+1} + \Delta H_{2t}^{2t+1} \cdot X_{2t+1} + N_{2t+1}$$

where $\Delta H_{2t}^{2t+1} = H_{2t+1} - H_{2t}$ is the matrix of variation of the channel between the instants 2t and 2t+1. The realistic assumption is made that the response of the channel varies little between two successive even-parity and odd-parity instants (2t, 2t+1), that is:

$$\Delta H_{2t}^{2t+1} \approx 0.$$

The following therefore can be written in matrix form:

$$\begin{bmatrix} Y_{2t} \\ Y_{2t+1} \end{bmatrix} = H_{2t} \cdot \begin{bmatrix} X_{2t} \\ X_{2t+1} \end{bmatrix} + \Delta H_{2t}^{2t+1} \cdot \begin{bmatrix} 0 \\ X_{2t+1} \end{bmatrix} + \begin{bmatrix} N_{2t} \\ N_{2t+1} \end{bmatrix},$$

in defining the 2×2 matrices of the signals respectively sent and received and of the noise X(t), Y(t) and N(t) during the two symbol times (2t, 2t+1) such that:

$$X(t) = \begin{bmatrix} X_{2t} \\ X_{2t+1} \end{bmatrix},$$

$$Y(t) = \begin{bmatrix} Y_{2t} \\ Y_{2t+1} \end{bmatrix},$$

$$N(t) = \begin{bmatrix} N_{2t} \\ N_{2t+1} \end{bmatrix},$$

where N(t) is the matrix of the noises during two symbol times on both antennas, the noise being assumed to be statistically independent, with a Gaussian distribution of probability, white and with an mean value of zero (AWGN or additive white Gaussian noise) and in assuming furthermore:

$$H(t) = H_{2t},$$

$$\Delta H'_{(t)} = \begin{bmatrix} 0 & 1 \\ 0 & 1 \end{bmatrix} \cdot \Delta H_{2t}^{2t+1}.$$

It is then possible to write the square matrix Y(t) of the signals received during two symbol times (2t, 2t+1) in the form:

$$Y(t) = H(t) \cdot X(t) + \Delta H'_{(t)} \cdot X(t) + N(t) \quad (3)$$

If the channel varies little between two symbol times, it may be considered that X(t) symbols are sent which are the 2×2 matrices with complex coefficients.

It is assumed in addition that the successive symbols X(t) and X(t+1) are mapped in two invertible matrices selected from an alphabet A of invertible matrices such that $X(t)=M_\alpha$ and $X(t+1)=M_\beta$.

We therefore have at reception:

$$Y_{(t)} = H_{(t)} \cdot M_\alpha + \Delta H'_{(t)} \cdot M_\alpha + N_{(t)}$$

$$Y_{(t+1)} = H_{(t+1)} \cdot M_\beta + \Delta H_{(t+1)} \cdot M_\beta N_{(t+1)} \quad (4)$$

The channel shall now be considered to vary little in time, i.e. during the four symbol times needed to send a code word or a window of encoded bits of any unspecified length, i.e. it possible to write H=H(t)=H(t+1) and, at reception:

$$Y(t) = H(t) \cdot M_\alpha + N(t)$$

$$Y(t+1) = H(t+1) \cdot M_\beta + N(t+1) \quad (5)$$

If the matrix Y(t) is multiplied by an inverse matrix denoted as $M_a^{-1}$ and the matrix Y(t+1) is multiplied by an inverse matrix denoted $-M_b^{-1}$, and if these two products are added, we obtain the analog syndrome denoted as Synd associated with the transmitted code word c by analogy with the known binary syndrome:

$$S_{ynd} = Y_{(t)} M_a^{-1} - Y_{(t+1)} M_b^{-1} \quad (6)$$

If, in the equation (6), the vectors received are replaced by their respective expressions of the equation (5), the following expression is obtained for the syndrome:

$$S_{ynd} = H_{(t)}(M_\alpha M_a^{-1} - M_\beta M_b^{-1}) + \Delta \quad (7)$$

with the corrective term $\Delta = N_{(t)} M_a^{-1} - N_{(t+1)} M_b^{-1}$.

To remove, to great extent, the need for prior knowledge of the channel matrix H(t), it is therefore necessary for the matrix $(M_\alpha M_a^{-1} - M_\beta M_b^{-1})$ to be as close as possible to the zero matrix $O_{2\times 2}$. The matrix $(M_\alpha M_a^{-1} - M_\beta M_b^{-1})$ then plays the equivalent role of a control matrix of the error-correcting code used.

The decoding algorithm will therefore consist in finding, from among the set of pairs $(M_a, M_b)$ of matrices corresponding to the possible code words c sent, the unique pair $(M_a, M_b)$ which minimizes the norm of the syndrome such that:

$$(\hat{M}_a, \hat{M}_b) = \text{Arg} \min_{(M_a, M_b)} \|Y(t) \cdot M_a^{-1} - Y(t+1) \cdot M_b^{-1}\|, \quad (8)$$

where $\|.\|$ represents the norm of a matrix, for example the Frobenius norm denoted as $\|.\|_F$ corresponding to the sum of the moduli of each of the coefficients of the matrix.

Since the matrices $M_\alpha$ and $M_\beta$ sent result from the redundant encoding according to the error-correcting code chosen and from the mapping of the code word in a set of invertible matrices, the minimizing of the syndrome is done on the set of possible code words c and therefore on all the payload information words x possible which have as their images $(M_a, M_b)$ (x).

Thus, the code word rebuilt from the received matrices is written as follows:

$$\hat{x} = \text{Arg} \min_{c(x) \in C \to (M_a, M_b)} \|Y_{(t)} M_a^{-1} - Y_{(t+1)} M_b^{-1}\|_F. \quad (9)$$

In addition, after having resolved the minimizing of the syndrome, we also obtain two noisy estimates of the channel matrix H(t) such that:

$$\hat{H}_{(t)}^1 = Y_{(t)} M_a^{-1} = H_{(t)} + N_{(t)} M_a^{-1}$$

$$\hat{H}_{(t)}^2 = Y_{(t+1)} M_b^{-1} = H_{(t)} + N_{(t+1)} M_b^{-1} \quad (10).$$

The invention claimed is:

1. A method for sending a source binary sequence comprising at least one source word x, in a transmission channel, wherein the method comprises the following steps for at least one source word x:

error-correcting encoding of the source word x with a sending device, delivering a code word c;

distributing, by said sending device, bits forming said code word c in at least two matrices called mapping matrices, invertible and complying with a criterion of uniqueness of cancellation of a syndrome associated with said code word c, so that a unique code word c corresponding to a unique pair of mapping matrices cancels the syndrome associated with said code word c, said mapping matrices carrying payload information of the source word x, said distributing being called a matrix mapping step and implementing a bijective correspondence between bits of said code word c and said at least two mapping matrices; and successively sending said at least two mapping matrices from said sending device, said criterion of uniqueness of the cancellation of the syndrome being written as follows, for the matrix mapping step delivering two matrices to be sent $M_\alpha$ and $M_\beta$ associated with said code word c:

$$M_\alpha \cdot M_a^{-1} - M_\beta \cdot M_b^{-1} = 0,$$

with $(M_a, M_b)$ being a unique pair of matrices corresponding to said code word c in a perfect case of constant channel transmission.

2. The method for sending according to claim 1, wherein said mapping step comprises a sub-step of permutation of said bits of said code word c, preliminarily to said distributing said bits forming said code word c.

3. The method for sending according to claim 1, wherein said mapping step distributes at least four bits ($c_0, c_1, c_2, c_3$) composing said code word c in a mapping matrix and said mapping matrix is selected from a known set of invertible matrices with complex coefficients, denoted as the Weyl group.

4. The method for sending according to claim 1, wherein said mapping step distributes at least eight bits ($c_0, c_1, c_2, \ldots c_7$) forming said code word c in a mapping matrix A and comprises the following sub-steps:

mapping according to the Gray mapping of the pairs ($c_2, c_3$), ($c_4, c_5$) and ($c_6, c_7$) delivering a triplet of complex symbols ($s_0, s_1, s_2$);

mapping of the pair ($c_0, c_1$) in inserting the complex number 0 in place ($2c_0+1$) in said triplet of complex symbols delivering a quadruplet of complex symbols;

distributing said complex symbols of said quadruplet in an invertible mapping matrix A.

5. The method for sending according to claim 4, wherein said mapping step furthermore comprises n steps of distributing at least eight bits forming said code word c, respectively in at least n mapping matrices $A_n$, with n being a non-zero integer and in that said method comprises a step of computing an overall mapping matrix to be sent corresponding to the sum $$A + \sum_{i=1}^{n} \frac{A_i}{2^i}.$$

6. A device for sending a source binary sequence comprising at least one source word x, in a transmission channel, wherein the device comprises, for at least one source word x:
  means for error-correcting encoding said source word x delivering a code word c;
  means for distributing bits forming said code word c in at least two matrices called mapping matrices, invertible and complying with a criterion of uniqueness of cancellation of a syndrome associated with said code word c, so that a unique code word c corresponding to a unique pair of mapping matrices cancels the syndrome associated with said code word, said mapping matrices carrying payload information of the source word x, said means for distributing being called matrix mapping means and implementing a bijective correspondence between bits of said code word c and said at least two mapping matrices; and
  means for successively sending said at least two mapping matrices,
  said criterion of uniqueness of the cancellation of the syndrome being written as follows, for the matrix mapping step delivering two matrices to be sent $M_\alpha$ and $M_\beta$ associated with said code word c:

$$M_\alpha \cdot M_a^{-1} - M_\beta \cdot M_b^{-1} = 0,$$

with $(M_a, M_b)$ being a unique pair of matrices corresponding to said code word c in a perfect case of constant channel transmission.

7. A method for receiving a sent binary sequence, after passage of said sent binary sequence in a transmission channel, delivering a rebuilt binary sequence comprising at least one rebuilt word,
  said sent binary sequence being obtained from a binary sequence comprising at least one source word x having undergone the following steps before sending, for at least one source word x:
    error-correcting encoding of said source word x delivering a code word c;
    distributing the bits forming the code word c in at least two matrices called mapping matrices, invertible and complying with a criterion of uniqueness of cancellation of a syndrome associated with said code word c, said distributing being called a matrix mapping step; and
    successively sending said at least two mapping matrices,
  wherein said method for receiving comprises the following steps for at least two matrices received:
    identifying at least two invertible decoding matrices with complex coefficients enabling compliance with a criterion of minimization of a norm of the syndrome associated with said code word c, the mapping matrices sent being selected so that a unique pair of decoding matrices minimizes the syndrome; and
    determining said rebuilt word from said identified decoding matrices,
  said criterion of minimization of the norm of the syndrome associated with said code word c is written as follows, for two received matrices Y(t) and Y(t+1) and two decoding matrices $M_a$ and $M_b$:

$$(\hat{M}_a, \hat{M}_b) = \mathrm{Arg} \min_{(M_a, M_b)} \|Y(t) \cdot M_a^{-1} - Y(t+1) \cdot M_b^{-1}\|,$$

where $\|.\|$ represents the norm of a matrix.

8. The method for receiving according to claim 7, wherein the method comprises, preliminarily to said step of determining said rebuilt word, the following steps for an error-correcting code implementing a convolutive code represented as a trellis:
  determining metrics of branches of sections of said trellis of the convolutive code, each branch being labeled by one of said decoding matrices; and
  implementing a Viterbi decoding algorithm from said branch metrics, delivering state metrics.

9. The method for receiving according to claim 8, wherein a metric $\gamma_t(M_b)$ of one of said branches labeled by a decoding matrix $M_b$ is determined by the following equation, for three matrices received Y(t−1), Y(t) and Y(t+1) and three decoding matrices $M_a$, $M_b$ and $M_c$:

$$\gamma_t(M_b) = \min_{(M_a, M_c)} \lambda \|Y(t-1) \cdot M_a^{-1} - 2Y(t) \cdot M_b^{-1} + Y(t+1) \cdot M_c^{-1}\| + \mu \|Y(t) - \hat{H}'(t) \cdot M_b\|,$$

where $\lambda$ and $\mu$ are adaptive weighting coefficients and $\hat{H}'(t)$ is an estimate of the channel matrix after convergence of the Viterbi decoding algorithm such that:

$$\hat{H}'(t) = (Y(t-1) \cdot M_a^{-1} + Y(t) \cdot M_b^{-1} + Y(t+1) \cdot M_c^{-1})/3.$$

10. A device for receiving a sent binary sequence, after passage of said sent binary sequence in a transmission channel, delivering a rebuilt binary sequence comprising at least one rebuilt word,
  said sent binary sequence being obtained from a binary sequence comprising at least one source word x, for which the following were implemented before transmission:
    means for error-correcting encoding of said source word x, delivering a code word c;
    means for distributing bits forming said code word c in at least two matrices called mapping matrices, invertible and complying with a criterion of uniqueness of cancellation of a syndrome associated with said code word c, said means for distributing being called matrix mapping means; and
    means for successively sending said at least two mapping matrices,
  wherein said device for receiving comprises, for at least two matrices received,
    means for identifying at least two invertible decoding coefficients with complex coefficients enabling compliance with a criterion of minimization of the norm of the syndrome associated with said code word c, the mapping matrices sent being selected so that a unique pair of decoding matrices minimizes the syndrome; and
    means for determining said rebuilt word from said identified decoding matrices,
  said criterion of minimization of the norm of the syndrome associated with said code word c being written as follows, for two received matrices Y(t) and Y(t+1) and two decoding matrices $M_a$ and $M_b$;

$$(\hat{M}_a, \hat{M}_b) = \underset{(M_a, M_b)}{\text{Arg min}} \|Y(t) \cdot M_a^{-1} - Y(t+1) \cdot M_b^{-1}\|,$$

where $\|.\|$ represents the norm of a matrix.

11. A non-transitory computer-readable memory comprising a computer program product stored thereon and comprising program code instructions implementing a method of sending a source binary sequence comprising at least one source word x, in a transmission channel, when said program is executed by a processor, wherein the method comprises the following steps for at least one source word:

- error-correcting encoding of the source word x with a sending device, delivering a code word c;
- distributing, by said sending device, bits forming said code word c in at least two matrices called mapping matrices, invertible and complying with a criterion of uniqueness of cancellation of a syndrome associated with said code word c, so that a unique code word c corresponding to a unique pair of mapping matrices cancels the syndrome associated with said code word c, said mapping matrices carrying payload information of the source word x, said distributing being called a matrix mapping step and implementing a bijective correspondence between bits of said code word c and said at least two mapping matrices; and
- successively sending said at least two mapping matrices from said sending device, said criterion of uniqueness of the cancellation of the syndrome being written as follows, for the matrix mapping step delivering two matrices to be sent $M_\alpha$ and $M_\beta$ associated with said word c:

$$M_\alpha \cdot M_a^{-1} - M_\beta \cdot M_b^{-1} = 0,$$

with $(M_a, M_b)$ being a unique pair of matrices corresponding to said word c in a perfect case of constant channel transmission.

* * * * *